United States Patent [19]

Sheng et al.

[11] Patent Number: 4,536,608
[45] Date of Patent: Aug. 20, 1985

[54] SOLAR CELL WITH TWO-DIMENSIONAL HEXAGONAL REFLECTING DIFFRACTION GRATING

[75] Inventors: Ping Sheng, Skillman; Aaron N. Bloch, Bridgewater, both of N.J.

[73] Assignee: Exxon Research and Engineering Co., Florham Park, N.J.

[21] Appl. No.: 488,436

[22] Filed: Apr. 25, 1983

[51] Int. Cl.³ ............................................ H01L 31/04
[52] U.S. Cl. ................................................... 136/259
[58] Field of Search ........................................ 136/259

[56] References Cited
U.S. PATENT DOCUMENTS
4,398,056 8/1983 Sheng .................................. 136/259

OTHER PUBLICATIONS

J. Müller, "Thin Silicon Film p-i-n Photodiodes with Internal Reflection", *IEEE Trans. Electron Devices,* vol. Ed-25, pp. 247-253, (1978).
J. Müller, "Ultrafast Multireflection-and Transparent Thin Film Silicon Photodiodes" (Approx. 1978).

*Primary Examiner*—Aaron Weisstuch
*Attorney, Agent, or Firm*—Ronald D. Hantman

[57] ABSTRACT

A solar cell which includes a thin layer of active material bounded on the side toward the incident light with an antireflection coating and bounded on the other side by a two-dimensional hexagonal reflecting diffraction grating to internally reflect the incident light back into the active material.

7 Claims, 4 Drawing Figures

SOLAR CELL WITH TWO-DIMENSIONAL HEXAGONAL REFLECTING DIFFRACTION GRATING

BACKGROUND OF THE INVENTION

The present invention concerns solar cells. In particular, the present invention is a solar cell whose absorption of incident solar light is enhanced in a range of light wavelengths where the intrinsic absorption by the semiconductor is especially weak by means of a two-dimensional reflecting diffraction grating.

Many of the materials used for solar cells, such as silicon, require a thick active layer because of low absorption of incident light. In particular, silicon has low solar absorptance in the infrared and far-infrared. However, such thickness requirements impose severe purity constraints on the material. This follows because the purity of the active material determines the lifetime of the electron-hole pair that is generated by the absorbed sunlight. The lifetime of the generated pair is proportional to the square of diffusion length. The diffusion length is the average length a generated carrier can travel before it recombines. Since the cell must be thick to allow for absorption of the incident sunlight, the diffusion length must be of the order of the thickness of the cell to allow for the generated pair to contribute to the electric current generated by the cell. This, in turn, requires high purity active material.

It is desireable to reduce the thickness of the active material for several reasons. First, a thin layer would reduce the amount and, therefore, the cost of the active material. Second, a thin layer would allow for a reduction in the diffusion length of the generated carriers. Shorter diffusion lengths allow for a reduction in the purity of the active material as discussed above.

SUMMARY OF THE INVENTION

The invention is a solar cell including an active layer of semi-conductor material fixed to a two-dimensional reflecting diffraction grating.

The diffraction grating is coated with a layer of reflecting material at the interface between the grating and the active material. The grating is a hexagonal array of a plurality of protrusions and depressions wherein the period between any two adjacent protrusions or depressions is the same.

In a preferred embodiment, the active layer is silicon and the diffraction grating is coated with a layer of silver.

DETAILED DESCRIPTION

For purposes of description, the present invention shall be illustrated and described with respect to a solar cell whose active material is silicon. However, it is to be understood that other active materials may be used.

The present invention is a solar cell in which some of the incident light that enters the cell is converted into "guided waves" inside the active material. These guided waves travel horizontally, parallel to the silicon film surface. These guided waves travel, on the average, a distance inside the silicon much longer than the thickness of the silicon. This allows the thickness of the silicon to be reduced so that the active material is but a thin film. The conversion of the incident light to waves traveling horizontal to the cell surface is accomplished by a diffraction grating fixed to one surface of the active material. The diffraction grating is a two-dimensional array having protrusions and depressions in a hexagonal array.

Figure 1:
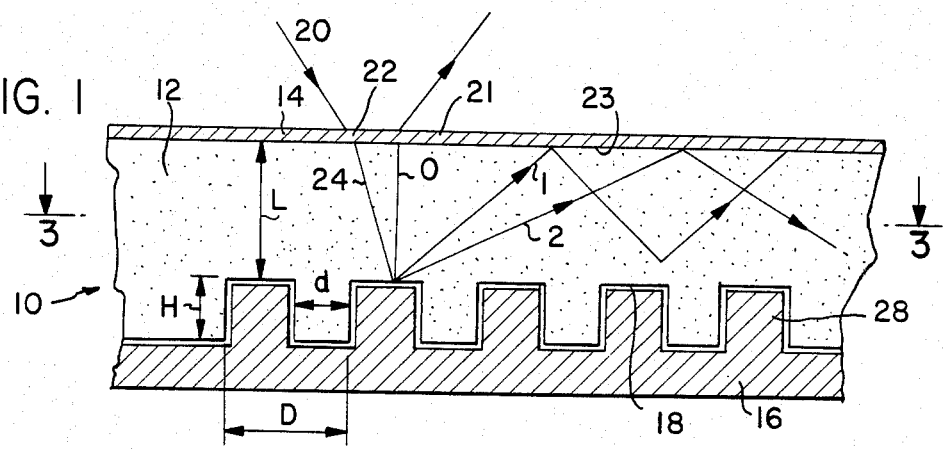
FIG. 1 is a cross-sectional view of a solar cell according to the present invention.

Referring to FIG. 1 shows a schematic diagram of the preferred embodiment of the present invention. The diagram of FIG. 1 shows the profile of the diffraction grating 16 of the solar cell 10. The solar cell 10 includes an active layer of semi-conductor material 12 of thickness L. The silicon structure may be crystalline, polycrystalline or amorphous. The surface of the silicon film 12 toward the incident light may be coated with an anti-reflection coating 14 to reduce reflection loss of the incident light. Such coatings include an evaporated layer of $SnO_2$ or $ZrO_2$ of the order of 0.07 $\mu$m thick. The surface of the silicon film 12 opposite the incident light is fixed to the reflecting diffraction grating 16. The diffraction grating 16 is coated on the side toward the incident light 20 with a reflecting material 18, preferably silver or aluminum. However, the most preferred material is silver. The silicon film 12 is deposited on the grating by either evaporation or other thin film deposition methods. When sunlight enters the solar cell at some arbitrary angle, the light is refracted due to the higher index of refraction of the antireflection coating and silicon according to Snell's Law $$N \sin i = n \sin r,$$

Where
N = index of refraction of first medium
n = index of refraction of second medium
i = angle with respect to the vertical of incident light
r = angle with respect to the vertical of light in second medium.

The incoming light ray 20 is refracted at each interface as it enters the solar cell. At the air-anti-reflection 21 coating interface, the light ray 20 is refracted toward the vertical in accordance with Snell's Law since the index of refraction of the coating exceeds that of air. Again at the anti-reflection coating-silicon interface 23, the light ray 24 is refracted toward the vertical because the index of refraction of silicon is greater than that of the anti-reflection coating.

Since the silicon layer 12 is a thin film, the light (with wavelength in the red or infrared) will most likely cross the silicon film 12 with small absorptance. As the light strikes the reflecting diffraction grating, it is diffracted into various diffraction orders labeled as 0, 1, and 2 etc.

Figure 2:
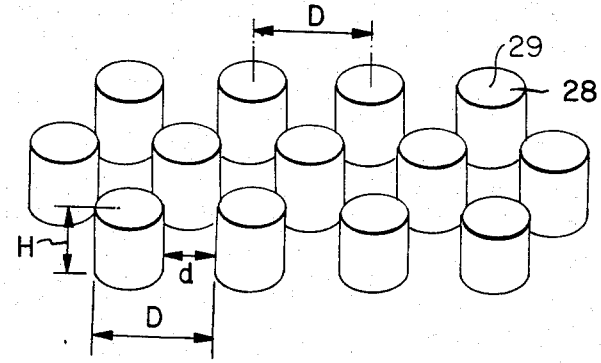
FIG. 2 is a perspective view of a preferred embodiment of the diffraction grating according to the present invention.

The diffraction grating 16 is a two-dimensional grating which includes a hexagonal array of protrusions and depressions. FIG. 2 shows one preferred embodiment of the grating of the present invention. The grating includes an array of protrusions in the form of cylinders 28 spaced a distance D apart. The distance is measured from the cross-sectional centers 29 of the cylinders. The periodicity of the grating is also equal to D. The spacing between the cylinders 28 is the distance d. The cylinders 28 have a height H.

Figure 3:
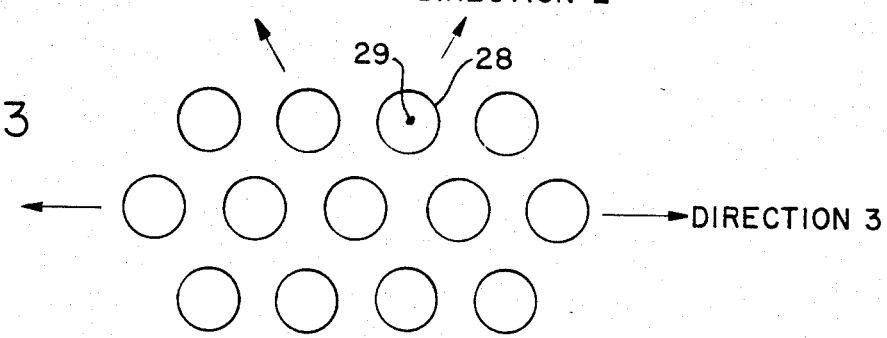
FIG. 3 is a top view of the diffraction grating in FIG. 2 or FIG. 4.

FIG. 3 is a top view of the FIG. 2 which shows the spacing between the cross-sectional centers 29 of the cylinders is the same between any two adjacent protrusions 28. Cross-sectional planes taken through the centers 29 in the directions 1, 2 and 3 of FIG. 3 intersect with an angle of 60°. The profiles of the grating in each of the directions 1, 2 and 3 is a rectangular wave.

Figure 4:
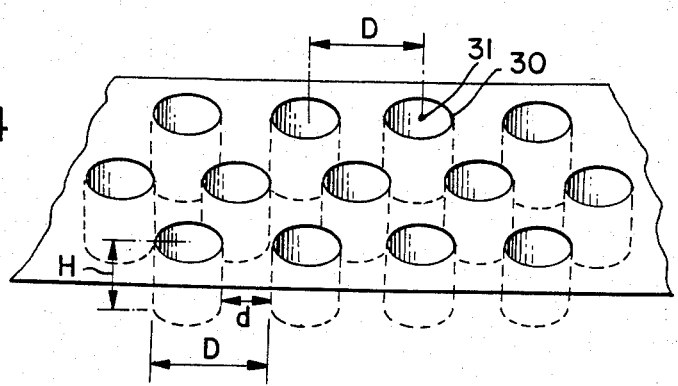
FIG. 4 is a perspective view of an alternative embodiment of the diffraction grating according to the present invention.

FIG. 4 shows an alternative embodiment of the grating of the 16 present invention. In this case, depressions 30 replace the protrusions 28 in the grating 16. The cross-sectional centers 29 of the protrusions 28 correspond to the cross-sectional centers 31 of the depressions 30. As shown in FIG. 4, the depressions 30 are cylindrical wherein the spacing between the cross sectional centers 31 of any two of the cylinders 30 is D, the spacing between any two cylinders is d and the depth of the cylinders is H. The relationship between cross-sectional planes in the directions 1,2 and 3 is the same for the protrusions 28 as it is for the depressions 30.

The figures have been drawn with the protrusions 28 and depressions 30 shown as right circular cylinders. However, the protrusions 28 and depressions 30 may have other geometrical shapes as long as each of the protrusions 28 have the same shape and each of the depressions 30 have the same shape. For example, the tops of the protrusions 28 or the bottoms of the depressions 30 may be rounded so as to form a hemispherical or cone shaped upper or lower end. In this case the period between any two adjacent protrusions 28 is the same and the period between any two adjacent depressions 30 is the same. In addition, the cross-section of the grating taken through the grating 16 so as to intersect all protrusions 28 or depressions 30 that are on a line and spaced one period, D, apart (i.e., in the direction 1, 2 or 3 of FIG. 3) is repetitive with a repeat distance D. In this case, the profile is not a rectangular wave with square corners but a wave with rounded upper corners (for the embodiment shown in FIG. 2) or rounded lower corners (for the embodiment shown in FIG. 4).

The diffracted light can be approximately considered as successive diffraction by three one-dimensional gratings all of which had the same general shape and period.

The diffraction grating 16 is preferably coated with silver on surface 18, which serves as the substrate on which the silicon film is deposited. This substrate may be any material for which one can easily write a grating on, for example, chromium. In addition, the grating 16 may be supported by glass or quartz to add strength to the structure. The diffraction angles for the various orders are determined by the periodicity of the grating D. The intensity distribution between various orders is determined by the grating depth H of the protrusion 28. Some of the diffraction orders, such as 0, will be able to exit from the silicon layer. However, many of the diffracted order, such as 1 to 2, will strike the top interface at angles with respect to the vertical greater than the critical angle, C, and therefore will be totally reflected.

The critical angle C is determined by the following formula:

$$\sin C = 1/N_{silicon}$$

when it can be assumed that the index of refraction for air is 1 and $N_{silicon}$ is the index of refraction of silicon.

The anti-reflection coating has no net effect on the critical angle.

The trapped diffracted orders e.g. 1 and 2 form the "guided modes" inside the silicon layer. Of course, when the totally reflected light hits the grating again, some of it will be diffracted out of the silicon layer.

As discussed above, the mechanism for mode confinement of the incident light is that the diffracted light strike the top interface with an angle greater than the critical angle. However, all rays that exceed the critical angle cannot propagate in the silicon layer. It it well-known that for a given wavelength only rays that intersect the surface at certain angles can be confined between two parallel surfaces. Therefore, only these rays can become "guided modes"; see e.g., Theory of Dielectric Optical Waveguides, Dietrich Marcuse, Academic Press 1974.

One of the advantages of the hexagonal arrangement of the present invention is that the grating can simultaneously couple to three guided modes along the directions 1, 2, and 3 shown in FIG. 3. In contrast, consider a two-dimensional grating in which the protrusions (or depressions) are arranged in a square lattice geometry such that the diffraction along each of the two principal orthogonal directions of the lattice (x, y) can couple effectively to a guided mode. Since the periodicity of the grating along the 45° line bisecting the two orthogonal directions will differ from that of the two principle directions (x, y), diffraction of the light in this 45° direction will in general not be coupled to a guided mode. However, for a hexagonal arrangement, shown in FIGS. 2 and 4, the periodicities along the three principle directions are the same. Therefore, such a grating can simultaneously couple to three guided modes as opposed to two for the normally incident light on square lattice arrangement. This increased coupling efficiency means that more light can be absorbed in a thin film, resulting in a solar-cell with higher efficiency.

The final equilibrum partition of the light in any of the three directions is governed by the parameters, d, D, L and the dielectric constants of the coating and the active materials, where λ is the wavelength of the incident light. These parameters may be chosen due to the following considerations. The absorption constant of crystalline silicon for light with $\lambda \leq 0.55$ μm is large and, therefore, no absorption enhancement is needed. In addition, light with $\lambda \geq 1.1$ μm is below the band gap energy for silicon and cannot generate electron-hole pairs. Therefore, it is only necessary to increase the absorption for the light spectrum between $\lambda = 0.55$ μm and $\lambda = 1.1$ μm. The param eters of the cell and grating are chosen so as to maximize the coupling of that portion of the light spectrum between $\lambda = 0.55$ μm and $\lambda = 1.1$ μm and the conversion of incident light to horizontally-traveling guided modes.

Example: An amorphous silicon solar cell with a two-dimensional hexagonal grating having the geometry specified below is constructed by putting the grating on a metal substrate, such as Cr, by electron beam lithography. The grating substrate is then coated with a 500 Å—thick Ag layer by evaporation. An active layer of 0.5 μm amorphous Si can the be deposited on top of this prepared substrate by the glow discharge of SiH₄. A 700 Å layer of TiO₂, or a 550 Å of ZrO₂, is evaporated on top of the amorphous silicon to act as an anti-reflection coating. The absorption of the cell with the grating substrate of the geometry specified below has been calculated where the effect of the hexagonal diffraction grating has been subdivided into successive diffractions by three one dimensional gratings with the same profile.

With $d/D=\frac{1}{2}$, $D=0.25$ μm, $h=800$ A, an enhancement of 6 mA/cm$^2$ is obtained over the flat substrate (also coated with Ag) case.

What is claimed is:

1. A solar cell comprising:
   (a) an active layer of semiconductor material having a pair of opposed surfaces,
   (b) a two dimensional diffraction grating fixed to one of said surfaces of said active layer and coated with a layer of reflecting material at the interface between said grating and said active material, said grating being a hexagonal array of a plurality of protrusions or depressions wherein said protrusions or depressions are of cylindrical shape such that the distance between the circular cross-sectional centers of said cylindrical shapes is the same between any two adjacent cylindrical shapes.

2. The solar cell of claim 1 wherein said diffraction grating is an array of cylindrical protrusions.

3. The solar cell of claim 1 wherein said diffraction grating is an array of cylindrical depressions.

4. The solar cell of claim 1 wherein the cross-section of the grating taken through said centers of any two adjacent depressions is a rectangular wave.

5. A solar cell comprising:
   (a) an active layer of semiconductor material having a pair of opposed surfaces,
   (b) a two-dimensional diffraction grating fixed to one of said surfaces of said active layer and coated with a layer of reflecting material at the interface between said grating and said active material, said grating being a hexagonal array of a plurality of protrusions or depressions wherein the spacing between any two adjacent protrusions or depressions is the same.

6. The solar cell of claim 5 wherein the cross-section of the grating taken through the centers of any two adjacent protrusions is a rectangular wave.

7. A solar cell comprising:
   (a) an active layer of semiconductor material having a pair of opposed surfaces,
   (b) a two-dimensional diffraction grating fixed to one of said surfaces of said active layer and coated with a layer of reflecting material at the interface between said grating and said active material, said grating being a hexagonal array of a plurality of protrusions or depressions wherein the angle of intersection between any two cross-sections of the grating taken through the cross-sectional centers of any one of said protrusions or said depressions and any two of its adjacent protrusions of depressions is 60° or a multiple thereof.

* * * * *